United States Patent
Nakamura

(10) Patent No.: US 7,666,760 B2
(45) Date of Patent: Feb. 23, 2010

(54) METHOD OF DIVIDING WAFER

(75) Inventor: Masaru Nakamura, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/272,320

(22) Filed: Nov. 17, 2008

(65) Prior Publication Data
US 2009/0142906 A1    Jun. 4, 2009

(30) Foreign Application Priority Data
Dec. 3, 2007    (JP) .............................. 2007-312323

(51) Int. Cl.
*H01L 21/00* (2006.01)
(52) U.S. Cl. ................ 438/464; 438/460; 257/E21.599
(58) Field of Classification Search ................ 438/460, 438/463, 464, 795; 257/E21.599
See application file for complete search history.

(56) References Cited
U.S. PATENT DOCUMENTS

2005/0037541 A1* 2/2005 Nagasawa et al. ........... 438/113

FOREIGN PATENT DOCUMENTS

| JP | B2 3408805 | 5/2003 |
|----|------------|--------|
| JP | A 2004-273895 | 9/2004 |

* cited by examiner

*Primary Examiner*—Bradley K Smith
(74) *Attorney, Agent, or Firm*—Greer, Burns & Crain, Ltd.

(57) ABSTRACT

A method of dividing a wafer includes: a denatured layer forming step of forming a denatured layer in the inside of the wafer along streets; a first feeding step in which the whole area of the wafer's back-side surface is suction held, and the wafer is mounted on a support base of a tape adhering unit, with the wafer's back-side surface on the upper side; a dicing tape adhering step of adhering a dicing tape to the wafer's back-side surface and an annular frame; a wafer reversing step of reversing the wafer and the annular frame face side back; a second feeding step of feeding said wafer and said annular frame to a tape expanding unit whole holding them by suction; a protective tape peeling step of peeling off a protective tape adhered to the wafer's face-side surface; and a wafer dividing step of expanding the dicing tape so as to divide the wafer along the streets along which the denatured layer has been formed.

1 Claim, 13 Drawing Sheets

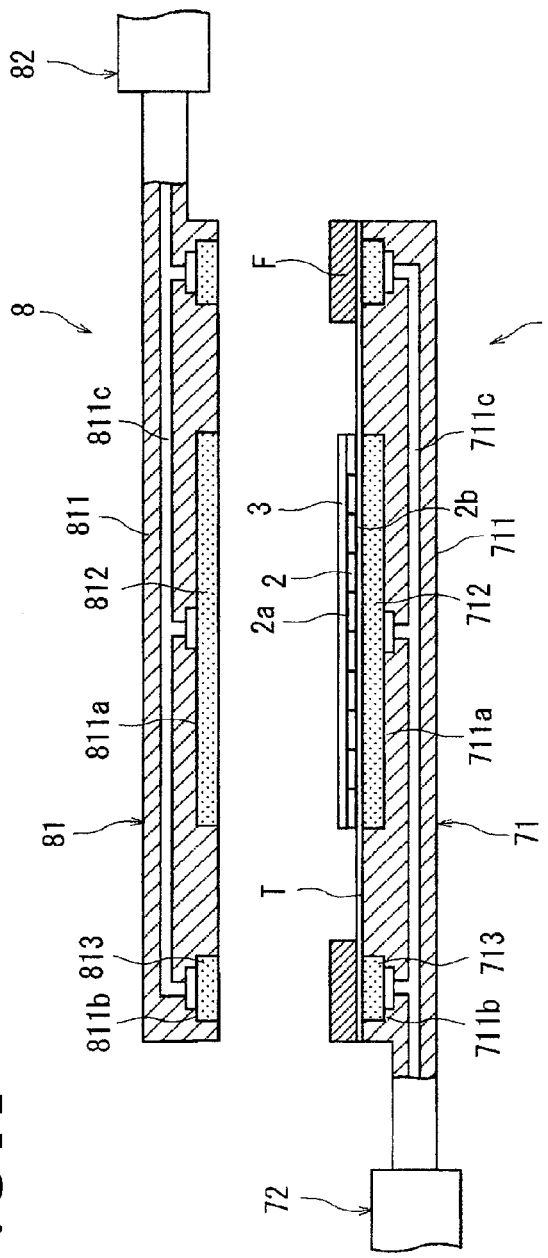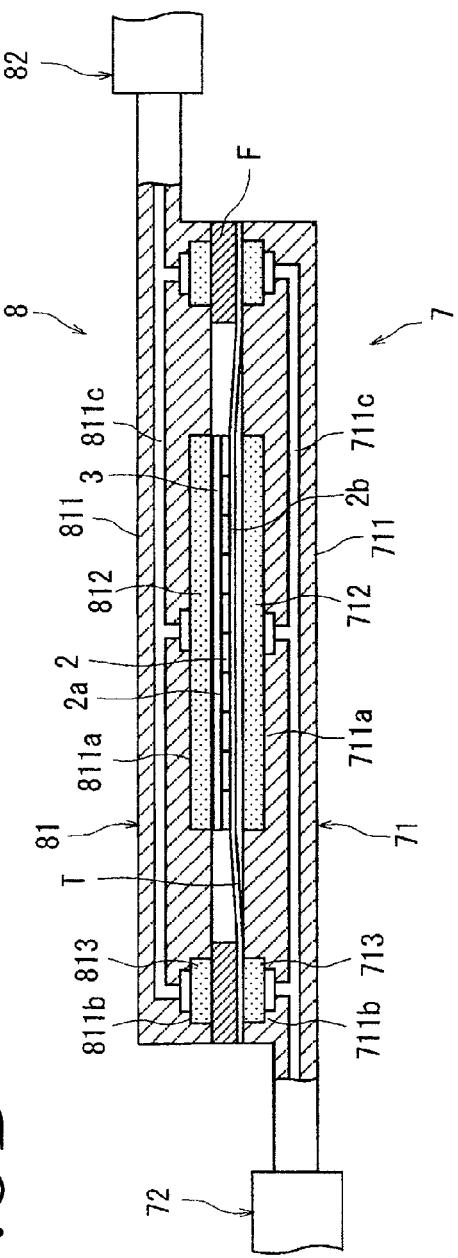

METHOD OF DIVIDING WAFER

BACKGROUND OF THE INVENTION

1. Field of the Invention

The present invention relates to a method of dividing a wafer, provided in its face-side surface with a plurality of streets in a grid pattern and provided with devices in a plurality of regions demarcated by the plurality of streets, along the streets into the individual devices (chips).

2. Description of the Related Art

In the semiconductor device manufacturing process, usually, a plurality of regions are demarcated by planned dividing lines called streets arranged in a grid pattern in a surface of a substantially circular disk-shaped semiconductor wafer, and devices such as ICs and LSIs are formed in the thus demarcated regions. Then, the wafer is cut along the streets, to manufacture the individual devices. Similarly, an optical device wafer in which a gallium nitride compound semiconductor and the like are laminated on a surface of a sapphire substrate is also cut along streets, to be divided into individual optical devices such as light emitting diodes and laser diodes, which are widely utilized for electric apparatuses.

As a method for dividing a plate-shaped work such as a semiconductor wafer, a laser beam machining method has been attempted in which a pulsed laser beam capable of being transmitted through the work is used, and irradiation with the pulsed laser beam is conducted by adjusting the focal point in the inside of the regions to be divided. In a dividing method based on the use of this laser beam machining method, a work is irradiated from one side thereof with a pulsed laser beam having such a wavelength as to be transmitted through the work while adjusting the focal point to the inside of the work, so as to continuously form a denatured layer in the inside of the work along the streets, and an external force is exerted along the streets where strength is lowered due to the formation of the denatured layer, thereby dividing the work (refer to, for example, Japanese Patent No. 3408805).

Besides, there has been proposed a method in which a wafer provided with a denatured layer along streets by the above-mentioned laser beam machining method is adhered to a dicing tape attached to an annular frame, then the dicing tape is expanded, whereby the wafer is divided along the streets where strength is lowered due to the formation of the denatured layer, into the individual devices (refer to, for example, Japanese Patent Laid-open No. 2004-273895).

Meanwhile, the wafer provided therein with the denatured layer along the streets is very susceptible to cracking. Therefore, the wafer may be broken or damaged in a feeding step in which the wafer provided therein with the denatured layer is fed from the laser beam machining apparatus for the purpose of adhering the wafer to the dicing tape, during when the wafer provided with the denatured layer is adhered to the dicing tape and/or in a feeding step in which the wafer adhered to the dicing tape is conveyed to a tape expanding unit.

SUMMARY OF THE INVENTION

Accordingly, it is an object of the present invention to provide a method of dividing a wafer by which a wafer provided therein with a denatured layer along streets can be divided along the streets without breaking or damaging the wafer during a feeding step or the like.

In accordance with an aspect of the present invention, there is provided a method of dividing a wafer, provided in its face-side surface with a plurality of streets in a grid pattern and provided with devices in a plurality of regions demarcated by the plurality of streets, along the plurality of streets, the method including: a protective tape adhering step of adhering a protective tape to the wafer's face-side surface; a denatured layer forming step in which the protective tape side of the wafer with the protective tape adhered to its face-side surface is held on a chuck table of a laser beam machining apparatus, with the wafer's back-side surface on the upper side, and the wafer is irradiated from its back side with a laser beam having such a wavelength as to be transmitted through the wafer, along the plurality of streets, so as to form a denatured layer in the inside of the wafer along the plurality of streets; a first feeding step in which, after the denatured layer forming step is carried out, the whole area of the wafer's back-side surface is suction held by a wafer feeding unit for feeding the wafer while holding the wafer by suction, and the protective tape side of the wafer is mounted on a support table of a tape adhering unit, with the wafer's back-side surface on the upper side; a dicing tape adhering step of adhering a dicing tape to the back-side surface of the wafer mounted on the support table of the tape adhering unit and to an annular frame disposed to surround the wafer; a wafer reversing step in which, after the dicing tape adhering step is carried out, the whole area of the wafer's back-side surface is suction held through the dicing tape and the annular frame is also suction held, by use of a wafer reversing unit for reversing the wafer and the annular frame while holding them by suction, and the wafer and said annular frame thus held are reversed face side back so that the protective tape adhered to the wafer's face-side surface is located on the upper side; a second feeding step in which, after the wafer reversing step is carried out, the whole area of the wafer's face-side surface is suction held through the protective tape and the annular frame is also suction held, by use of a wafer and frame feeding unit for feeding the wafer and the annular frame while holding them by suction, and the annular frame is mounted on an annular frame holding member of a tape expanding unit and the dicing tape side of the wafer is mounted on a wafer holding table of the tape expanding unit, with the protective tape adhered to the wafer's face-side surface being on the upper side; a protective tape peeling step in which the annular frame mounted on the frame holding member of the tape expanding unit is fixed, the wafer mounted on the wafer holding table is suction held through the dicing tape, and the protective tape adhered to the wafer's face-side surface is peeled off; and a wafer dividing step in which, after the protective tape peeling step is carried out, the suction holding of the wafer by the wafer holding table is released, and the dicing tape is expanded, whereby the wafer is divided along the plurality of streets along which the denatured layer has been formed, into the individual devices.

In the method of dividing a wafer according to the present invention, the whole surface area of the wafer is held by suction at the times of carrying out the first feeding step in which the wafer subjected to the denaturing layer forming step and thereby provided therein with the denatured layer along the plurality of streets is fed to the tape adhering unit, the wafer reversing step in which the wafer subjected to the dicing tape adhering step at the tape adhering unit is reversed face side back, and the second feeding step in which the wafer reversed face side back in the wafer reversing step is fed to the tape expanding unit. Therefore, the wafer is not broken or damaged notwithstanding the wafer has been provided therein with the denatured layer along the streets by carrying out the denatured layer forming step.

In addition, at the time of carrying out the protective tape peeling step in which the protective tape adhered to the wafer's face-side surface is peeled off at the tape expanding unit, the whole area of the wafer's back-side surface is suction held through the dicing tape. Therefore, the wafer is not broken or damaged notwithstanding the wafer has been provided therein with the denatured layer along the streets. Accordingly, the wafer is not broken or damaged before the wafer dividing step in which the wafer is divided along the plurality of streets, along which the denatured layer has been formed, into the individual devices by expanding the dicing tape.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 9A and 9B illustrate a wafer transferring step in the second feeding step in the method of dividing a wafer according to the invention;

DETAILED DESCRIPTION OF THE PREFERRED EMBODIMENT

Figure 1:
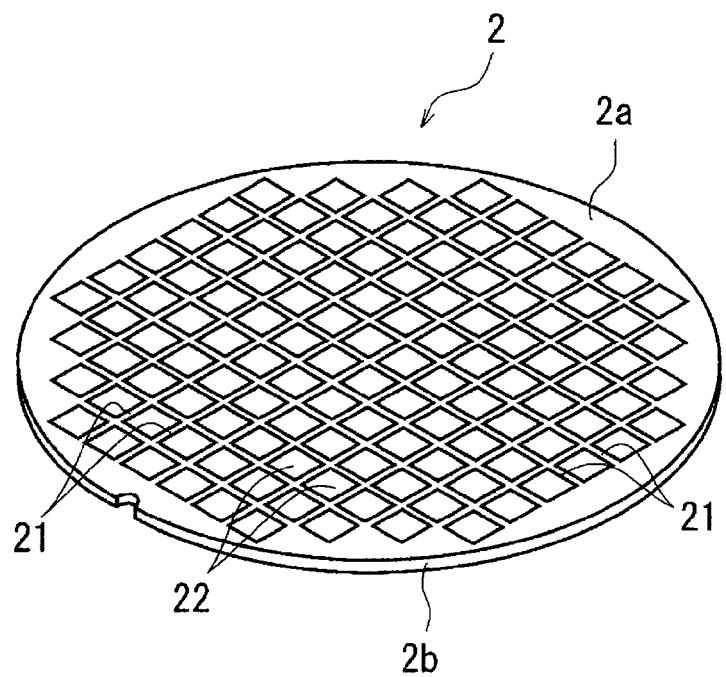
FIG. 1 is a perspective view of a semiconductor wafer as a wafer to be divided into individual devices by the method of dividing a wafer according to the present invention.
Figure 2:
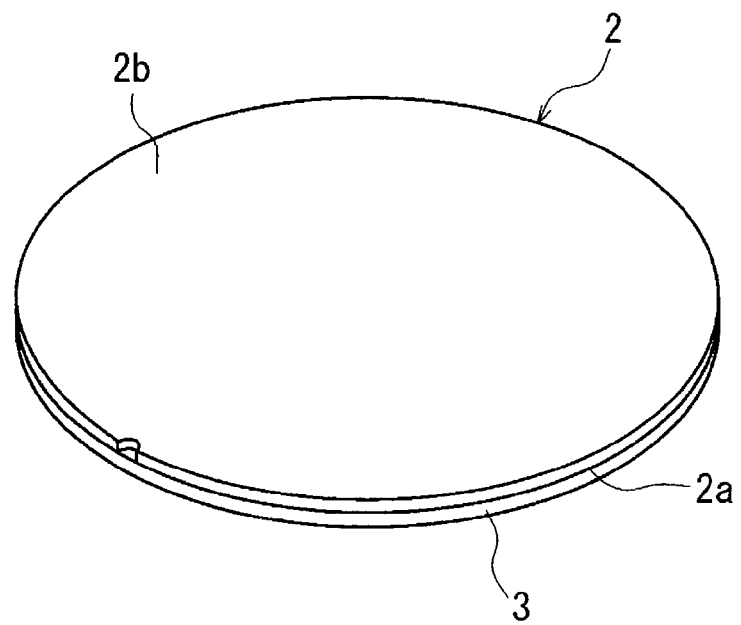
FIG. 2 is a perspective view showing the condition where a protective tape is adhered to the face-side surface of the semiconductor wafer shown in FIG. 1.

Now, a preferred embodiment of the method of dividing a wafer according to the present invention will be described in detail below, referring to the attached drawings. FIG. 1 shows a perspective view of a semiconductor wafer as a wafer to be divided by the method of dividing a wafer according to the present invention. The semiconductor wafer 2 shown in FIG. 1 is included of a silicon wafer having a thickness of 150 μm, for example, and is provided in its face-side surface 2a with a plurality of streets 21 in a grid pattern. At the face-side surface 2a of the semiconductor wafer 2, devices 22 such as ICs and LSIs are formed in a plurality of regions demarcated by the plurality of streets 21. Now, the method of dividing a wafer by which the semiconductor wafer 2 is divided into the individual devices 22 (chips) will be described below. In order to protect the devices 22, a protective tape 3 is adhered to the face-side surface 2a of the semiconductor wafer 2 as shown in FIG. 2 (protective tape adhering step). As the protective tape 3, in the embodiment shown, a polyolefin sheet having a thickness of 150 μm is used.

After the protective tape 3 is adhered to the face-side surface 2a of the semiconductor wafer 2 by carrying out the protective tape adhering step, a denatured layer forming step is conducted in which the semiconductor wafer 2 is irradiated from its back side with a laser beam of such a wavelength as to be transmitted through the silicon wafer, along the streets 21, whereby a denatured layer is formed in the inside of the semiconductor wafer 2 along the streets 21. The denatured layer forming step, in the embodiment shown, is carried out by use of a laser beam machining apparatus shown in FIG. 3. The laser beam machining apparatus 4 shown in FIG. 3 includes a chuck table 41 for holding a work, laser beam irradiation means 42 for irradiating the work held on the chuck table 41 with the laser beam, and image pickup means 43 for picking up an image of the work held on the chuck table 41. The chuck table 41 is so configured as to hold the work by suction, and can be moved in a machining feed direction indicated by arrow X in FIG. 3 and an indexing feed direction indicated by arrow Y in FIG. 3, by a moving mechanism (not shown).

The laser beam irradiation means 42 includes a hollow cylindrical casing 421 disposed substantially horizontally. Pulsed laser beam oscillating means (not shown) having a pulsed laser beam oscillator composes of a YAG laser oscillator or a YVO4 laser oscillator and repetition frequency setting means is disposed inside the casing 421. A condenser 422 by which a pulsed laser beam oscillated from the pulsed laser beam oscillating means is condensed is mounted to a tip part of the casing 421.

In the embodiment shown, the image pickup means 43 attached to a tip part of the casing 421 which constitutes the laser beam irradiation means 42 includes, in addition to an ordinary image pickup device (CCD) for picking up an image by use of a visible beam, infrared illuminating means for irradiating the work with infrared rays, an optical system for catching the infrared rays radiated from the infrared illuminating means, an image pickup device (infrared CCD) for outputting an electrical signal corresponding to the infrared rays caught by the optical system, and the like, and a picture signal of a picked-up image is sent therefrom to control means (not shown).

Figure 3:
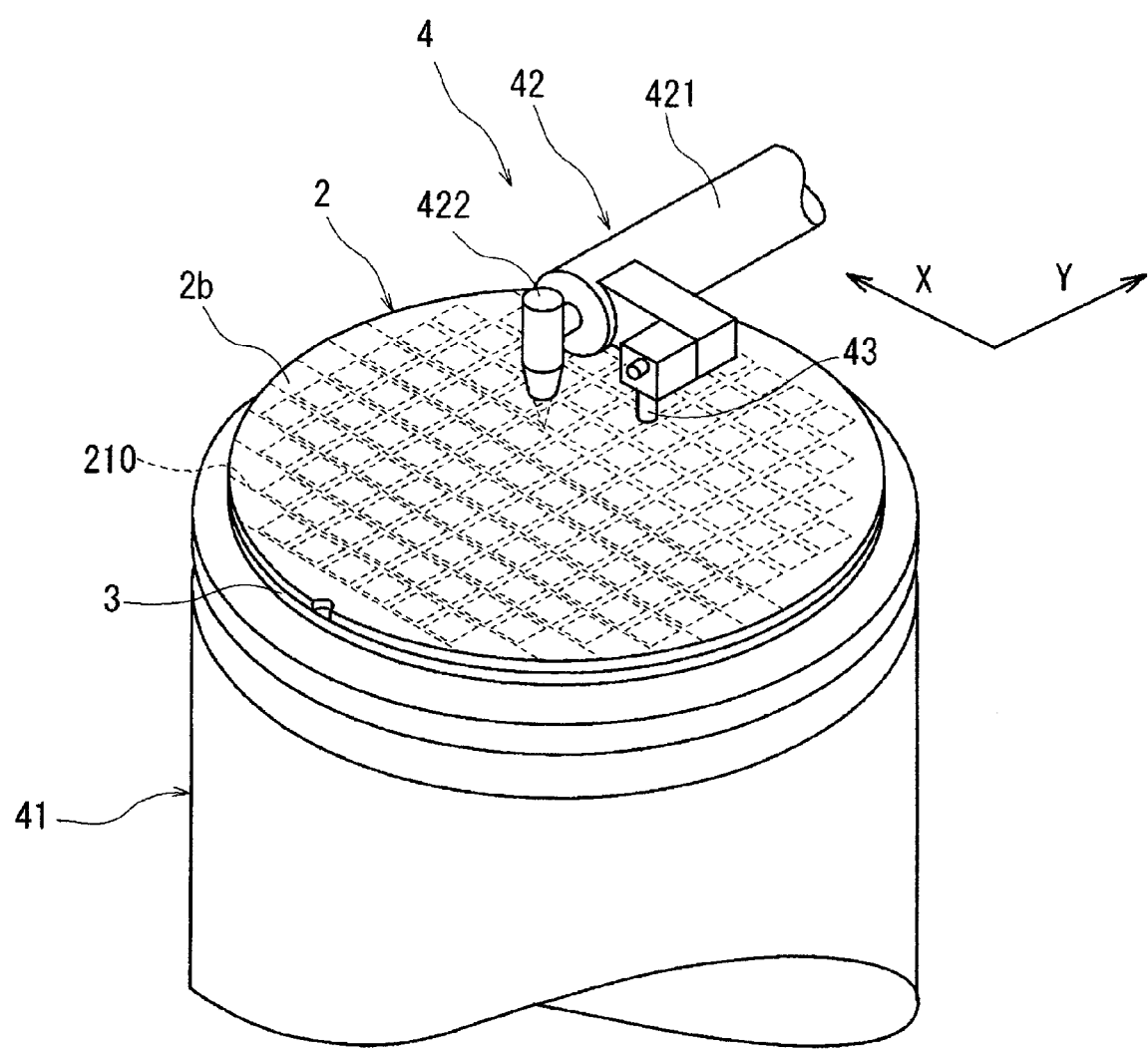
FIG. 3 is an essential part perspective view of a laser beam machining apparatus for carrying out the denatured layer forming step in the method of dividing a wafer according to the invention.

In carrying out the denatured layer forming step by use of the laser beam machining apparatus 4 as above-described, the protective tape 3 side of the semiconductor wafer 2 is mounted on the chuck table 41 of the laser beam machining apparatus 4, as shown in FIG. 3. Then, the semiconductor wafer 10 is suction held on the chuck table 41 by suction means (not shown) (wafer holding step). Therefore, the semiconductor wafer 2 held on the chuck table 41 by suction has its back-side surface 2b on the upper side.

After the wafer holding step is carried out as above-mentioned, a denatured layer forming step is conducted in which the semiconductor wafer 2 is irradiated with a pulsed laser beam of such a wavelength as to be transmitted through the silicon wafer constituting the semiconductor wafer 2 from its back-side surface 2b side, along the streets 21, so as to form a denatured layer in the inside of the semiconductor wafer 2 along the streets 21. In carrying out the denatured layer forming step, first, the chuck table 41 holding the semiconductor wafer 2 by suction is positioned into a position just under the image pickup means 43 by the moving mechanism (not shown). Then, an alignment work is carried out in which a work region, to be laser beam machined, of the semiconductor wafer 2 is detected by the image pickup means 43 and the control means (not shown). Specifically, the image pickup means 43 and the control means (not shown) perform image processing such as pattern matching for matching the positions of the street 21 formed in a predetermined direction of the semiconductor wafer 2 and the condenser 422 of the laser beam irradiation means 42 for irradiation with the laser beam along the street 21 to each other, whereby alignment of the laser beam irradiation position is carried out.

In addition, for the street 21 formed in the semiconductor wafer 2 and extending in a direction orthogonal to the predetermined direction, also, alignment of the laser beam irradiation position is similarly conducted (alignment step). In this case, although the face-side surface 2a provided with the streets 21 of the semiconductor wafer 2 is located on the lower side, the image of the streets 21 can be picked up on the back-side surface 2b side in a see-through manner, since the image pickup means 43 has the image pickup means composed of the infrared illuminating means, the optical system for catching the infrared rays, the image pickup device (infrared CCD) for outputting an electrical signal corresponding to the infrared rays thus caught, and the like, as above-mentioned.

Figure 4A:
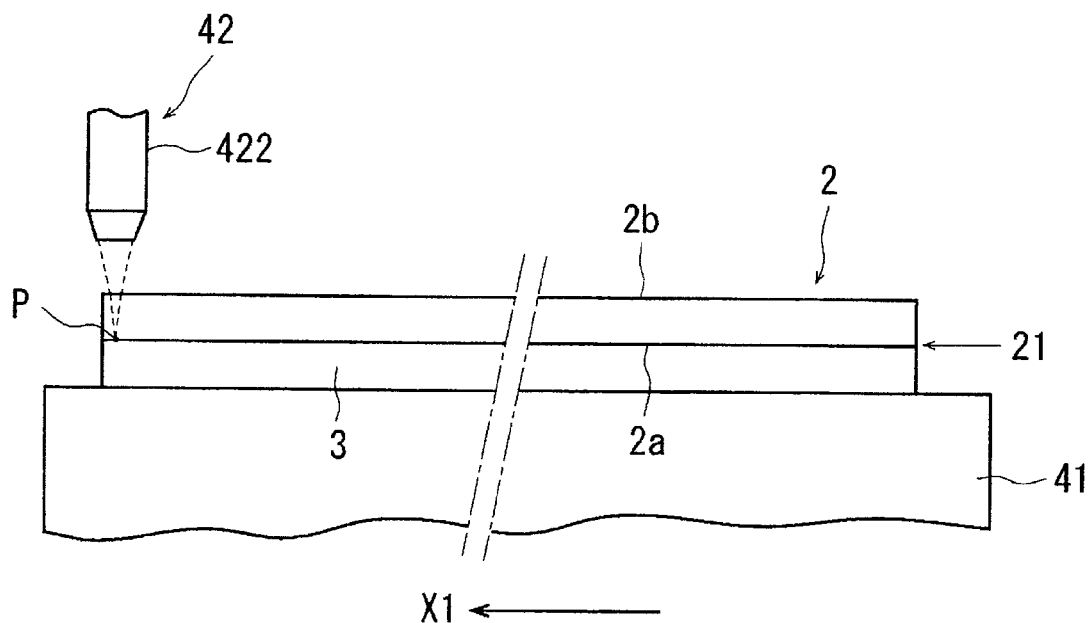
FIGS. 4A and 4B illustrate the denatured layer forming step in the method of dividing a wafer according to the invention.
Figure 4B:
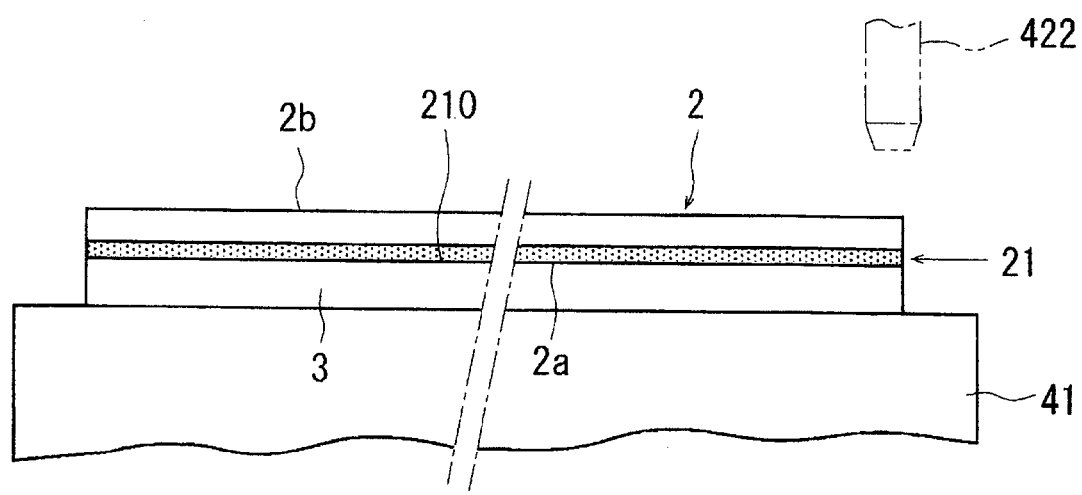

After the alignment step is carried out in the above-mentioned manner, the chuck table 41 is moved into a laser beam irradiation region where the condenser 422 of the laser beam irradiation means 42 for irradiation with the laser beam, and one end (the left end in FIG. 4A) of a predetermined street 21 is positioned into a position just under the condenser 422 of the laser beam irradiation means 42, as shown in FIG. 4A. Then, while radiating the pulsed laser beam of such a wavelength as to be transmitted through the silicon wafer through the condenser 422, the chuck table 41 is moved in the direction indicated by arrow X1 in FIG. 4A at a predetermined feed rate. Thereafter, when the position of irradiation through the condenser 422 has reached the other end (the right end in FIG. 4B) of the street 21 as shown in FIG. 4B, the radiation of the pulsed laser beam is stopped, and the movement of the chuck table 41 is stopped. In the denatured layer forming step, the converging point P of the pulsed laser beam is adjusted to a position near the face-side surface 2a (lower surface) of the semiconductor wafer 2, whereby the semiconductor wafer 2 is provided therein with a denatured layer 210 which is exposed at the face-side surface 2a (lower surface) and ranges from the face-side surface 2a to the inside of the semiconductor wafer 2. The denatured layer 210 is formed as a melted and resolidified layer.

The machining conditions in the denatured layer forming step are set, for example, as follows.

| Light source: | LD-excited Q switch Nd:YVO4 pulsed laser |
|---|---|
| Wavelength: | 1064 nm (pulsed laser) |
| Repetition frequency: | 100 kHz |
| Energy density at converging point: | $2.0 \times 10E11$ W/cm$^2$ |
| Converged spot diameter: | $\phi 1$ μm |
| Machining feed rate: | 100 mm/sec |

Figure 5:
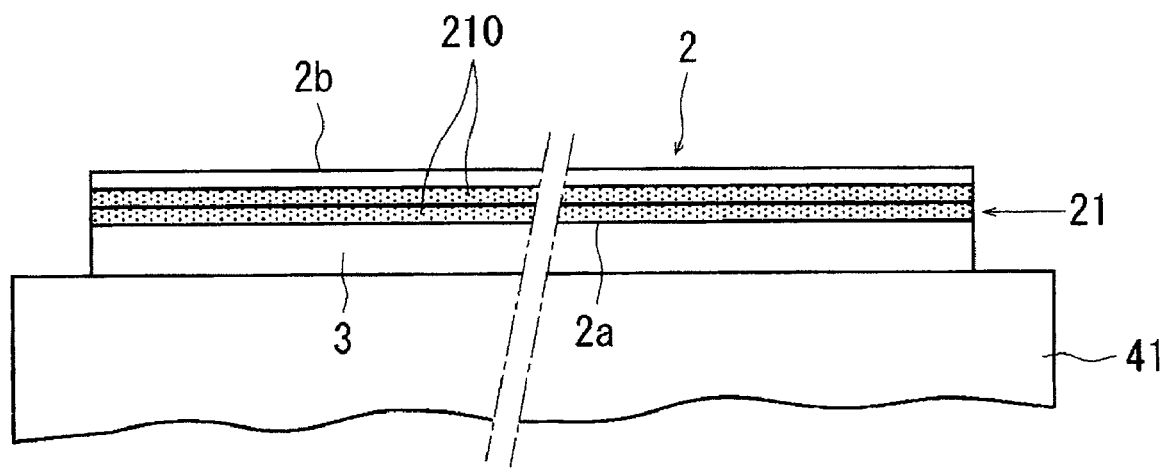
FIG. 5 illustrates the condition where denatured layers are stackedly formed in the inside of a semiconductor wafer in the denatured layer forming step shown in FIGS. 4A and 4B.

Incidentally, in the case where the semiconductor wafer 2 is thick, the denatured layer forming step as above-mentioned is carried out plural times while changing the converging point P stepwise, thereby to form a plurality of denatured layers 210, as shown in FIG. 5. For example, under the above-mentioned machining conditions, the thickness of the denatured layer by one-time run of the denatured layer forming step is about 50 μm, and the denatured layer forming step may, for example, be carried out twice to form the denatured layers 210 in a total thickness of 100 μm. Besides, three denatured layers may be formed in a semiconductor wafer 2 having a thickness of 150 μm so that the denatured layers are formed in the inside of the semiconductor wafer 2 along the street 2 and over a thickness range of from the face-side surface 2a to the back-side surface 2b. In addition, the denatured layer(s) 210 may be formed only in the inside of the semiconductor wafer 2 so as not to be exposed at the face-side surface 2a or the back-side surface.

After the denatured layer forming step is carried out along all the streets 21 extending in the predetermined direction of the semiconductor wafer 2 in the above-mentioned manner, the chuck table 41 is turned by 90 degrees, and then the denatured layer forming step is carried out along each of the streets extending in the direction orthogonal to the predetermined direction.

After the denatured layer forming step is conducted along all the streets 21 formed in the semiconductor wafer 2 in the manner as above-mentioned, a first feeding step is carried out in which the whole area of the back-side surface of the semiconductor wafer 2 is held by suction, and the protective tape 3 side of the semiconductor wafer 2 is mounted on a support table of a tape adhering unit, with the back-side surface of the semiconductor wafer 2 being on the upper side. The first feeding step is carried out by use of a wafer feeding unit 5 shown in FIGS. 6A to 6C. The wafer feeding unit 5 shown in FIGS. 6A to 6C includes a holding pad 51, and support means 52 for supporting the holding pad 51. The holding pad 51 has a holding frame 511 provided in its lower surface with a circular recess 511a, and a suction pad 512 formed from a porous ceramic and fitted in the recess 511a in the holding frame 511. The suction pad 512 is formed in such a size as to be able to hold the whole area of the back-side surface of the semiconductor wafer 2. In addition, the recess 511a formed in the holding frame 511 is in communication with suction means (not shown) through a suction passage 511b. Therefore, when the suction means (not shown) is operated, a negative pressure is made to act at the lower surface of the suction pad 512 through the suction passage 511b and the recess 511a. The support means 52 has lift means (not shown) for lifting up and down the holding pad 51 in the vertical direction, and can be moved in a horizontal direction by moving means (not shown).

Figure 6A:
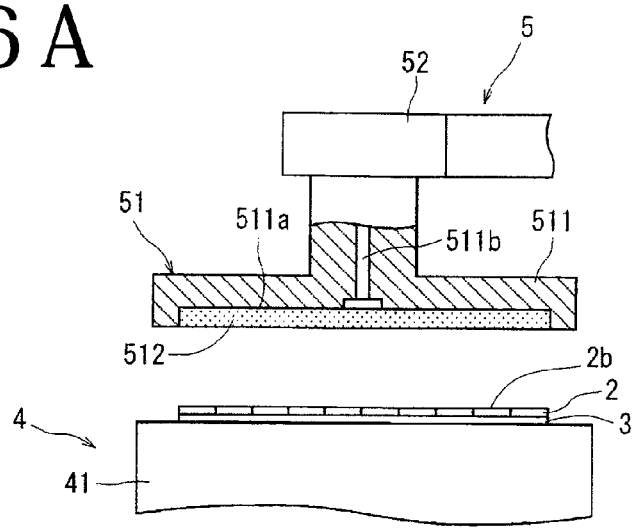
FIGS. 6A to 6C illustrate a first feeding step in the method of dividing a wafer according to the invention.
Figure 6B:
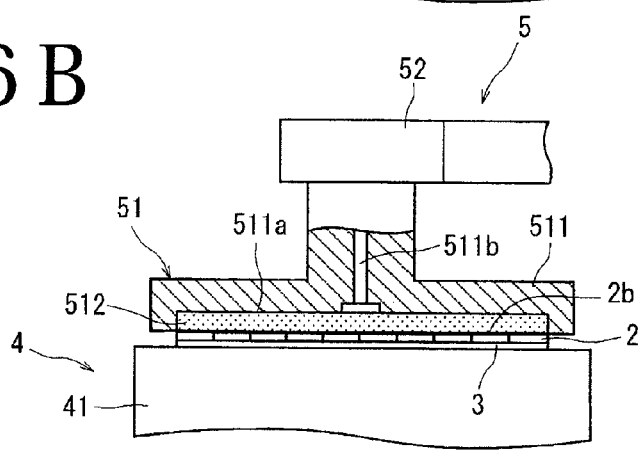
Figure 6C:
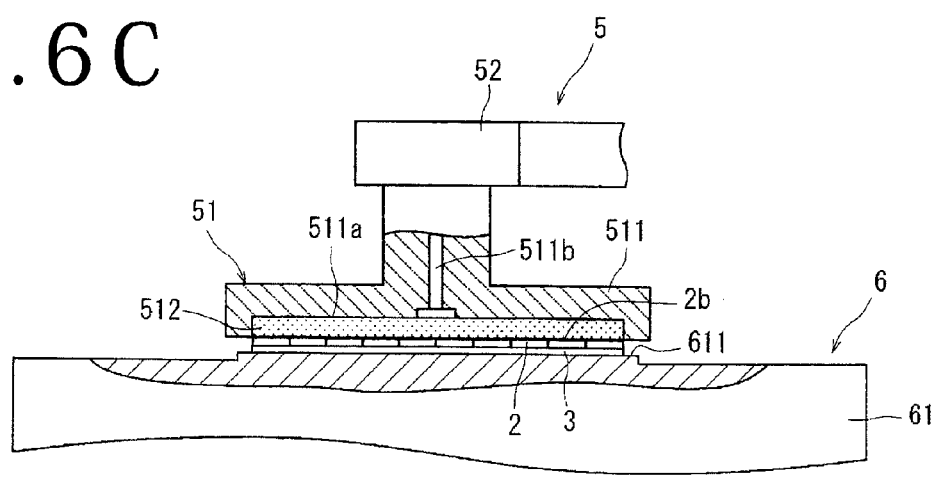

In carrying out the first feeding step by use of the wafer feeding unit 5, the holding pad 51 is moved to a position just over the semiconductor wafer 2 having undergone the denatured layer forming step on the chuck table 41 of the laser beam machining apparatus 4 as shown in FIG. 6A, and the holding pad 51 is lowered by the lift means (not shown) so as to bring the lower surface of the suction pad 512 into contact with the back-side surface 2b (upper surface) of the semiconductor wafer 2. Then, the suction means (not shown) is operated to cause a negative pressure to act at the lower surface of the suction pad 512, whereby the whole area of the back-side surface 2b of the semiconductor wafer 2 is suction held onto the lower surface of the suction pad 512. After the whole area of the back-side surface 2b of the semiconductor wafer 2 is suction held onto the lower surface of the suction pad 512 in this manner, the holding pad 51 is lifted up by the lift means (not shown), as shown in FIG. 6B. Next, the moving means (not shown) is operated to move the holding pad 51 to a position just over a support table 61 of a tape adhering unit 6 as shown in FIG. 6C. Further, the lift means (not shown) is operated to lower the holding pad 51, whereby the protective tape 3 adhered to the back-side surface 2a of the semiconductor wafer 2 suction held on the lower surface of the suction pad 512 is mounted on the upper surface of a wafer mounting region 611 formed in a central part of the support table 61.

Incidentally, the wafer mounting region 611 formed in the central part of the support table 61 of the tape adhering unit 6 is formed to be slightly higher than an outer peripheral part so as to ensure that the upper surface of an annular frame (to be described later) and the back-side surface 2b (upper surface) of the semiconductor wafer 2 will be at the same level. After the protective tape 3 adhered to the face-side surface 2a of the semiconductor wafer 2 suction held on the holding pad 51 is mounted on the wafer mounting region 611 of the support table 61 constituting the tape adhering unit 6 in the above-mentioned manner, the suction holding of the semiconductor wafer 2 by the holding pad 51 is released, and the holding pad 51 is lifted up and moved into a stand-by position. In the first feeding step as above, the whole area of the back-side surface 2b of the semiconductor wafer 2 is suction held on the lower surface of the suction pad 512 constituting the holding pad 51 as above-mentioned, and, therefore, the semiconductor wafer 2 is not broken or damaged notwithstanding the denatured layer(s) 210 has been formed in the inside of the semiconductor wafer 2 along the streets 21 by carrying out the denatured layer forming step.

Figure 7A:
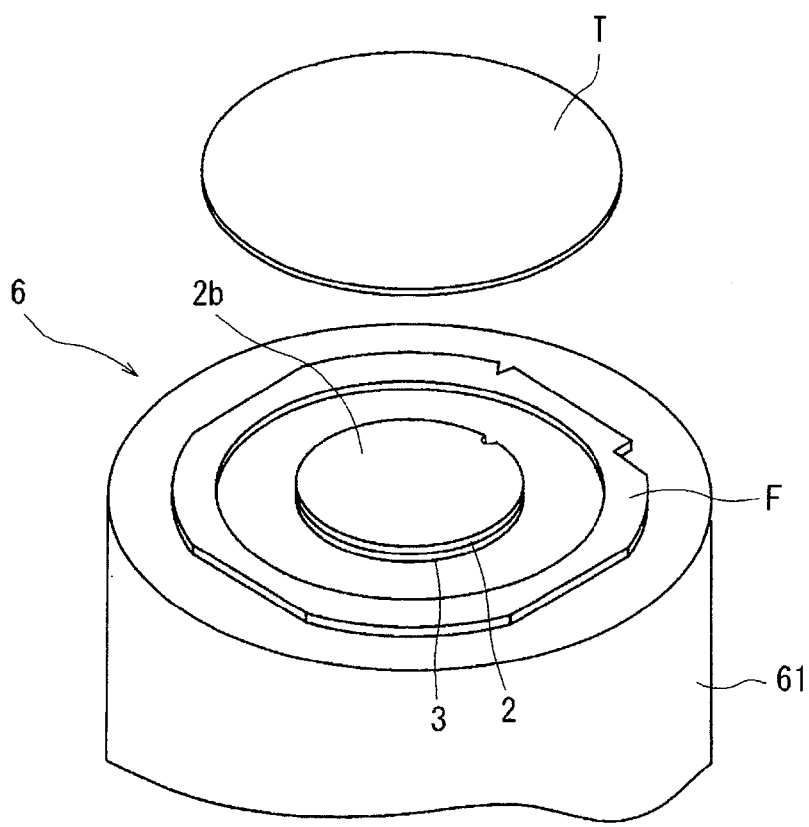
FIGS. 7A and 7B illustrate the dicing tape adhering step in the method of dividing a wafer according to the invention.
Figure 7B:
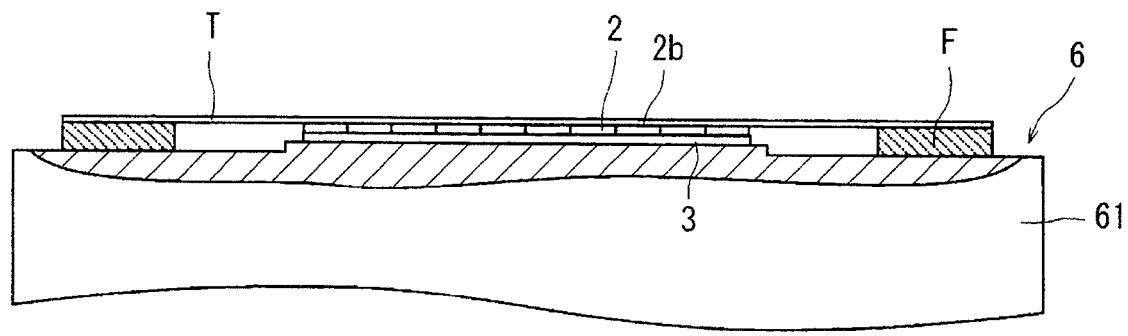

After the above-mentioned first feeding step is conducted, a dicing tape adhering step is carried out in which a dicing tape is adhered to the back-side surface 2b of the semiconductor wafer 2 mounted on the support base 6 of the tape adhering unit 6 and to an annular frame disposed to surround the semiconductor wafer 2. Specifically, as shown in FIG. 7A, the annular frame F is mounted on the upper surface of an outer peripheral part of the support table 61 of the tape adhering unit 6 (frame mounting step). Incidentally, the frame mounting step may be carried out before the first feeding step is conducted. After the annular frame F is mounted on the upper surface of the outer peripheral part of the support table 61 of the tape adhering unit 6, the dicing tape T is adhered to the back-side surface 2b of the semiconductor wafer 2 and to the annular frame F, as shown in FIG. 7B. Incidentally, the dicing tape T, in the embodiment shown, has a structure in which a surface (the lower surface in FIG. 7B) of a sheet base material of polyvinyl chloride (PVC) having a thickness of 100 μm is coated with an acrylic resin-based pressure sensitive adhesive in a thickness of about 5 μm.

After the dicing tape adhering step as above is carried out, a wafer reversing step is conducted in which the whole area of the back-side surface 2b of the semiconductor wafer 2 is suction held through the dicing tape T, the annular frame F is also suction held, and the semiconductor wafer 2 and the annular frame F thus held are reversed face side back so that the protective tape 3 adhered to the face-side surface 2a of the semiconductor wafer 2 is located on the upper side. The wafer reversing step is carried out by use of a wafer reversing unit shown in FIGS. 8A and 8B. The wafer reversing unit 7 has a holding pad 71, and support means 72 for supporting the holding pad 71. The holding pad 7 includes: a holding frame 711 having a circular recess 711a formed in the lower surface of a central part thereof, and an annular recess 711b formed in the manner of surrounding the circular recess 711a; a circular first suction pad 712 formed from a porous ceramic and fitted in the circular recess 711a in the holding frame 711; and an annular second suction pad 713 formed from a porous ceramic and fitted in the annular recess 711b in the holding frame 711.

The circular first suction pad 712 is formed in such a size as to be able to hold the whole area of the back-side surface of the semiconductor wafer 2, and the annular second suction pad 713 is formed in such a size as to be able to hold the annular frame F. In addition, the circular recess 711a and the annular recess 711b formed in the holding frame 711 are in communication with suction means (not shown) by way of a suction passage 711c. Therefore, when the suction means (not shown) is operated, a negative pressure is made to act at the surfaces of the first suction pad 712 and the second suction pad 713 through the suction passage 711c, the circular recess 711a and the annular recess 711b. The support means 72 has reversing means (not shown) for reversing the holding pad 71, and can be moved in the vertical direction and horizontal directions by moving means (not shown).

Figure 8A:
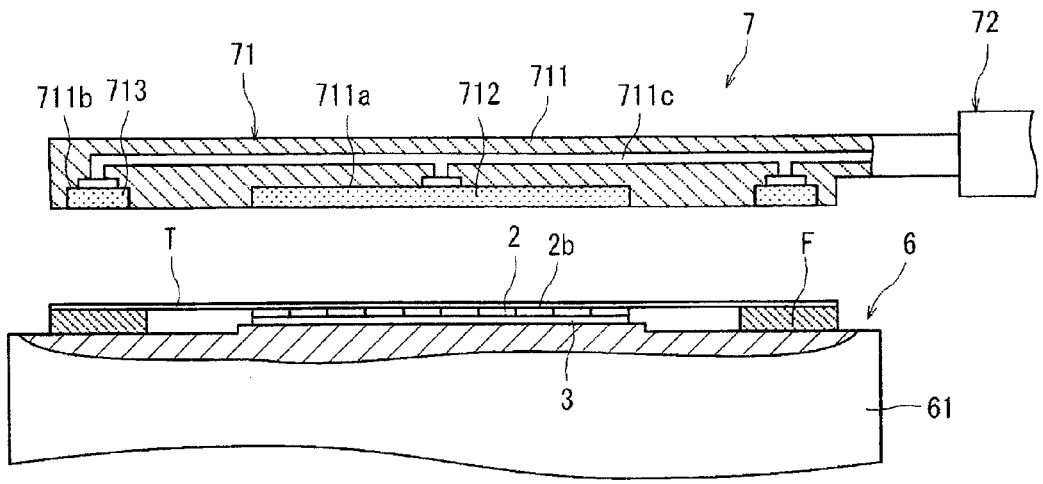
FIGS. 8A to 8C illustrate the wafer reversing step in the method of dividing a wafer according to the invention.
Figure 8B:
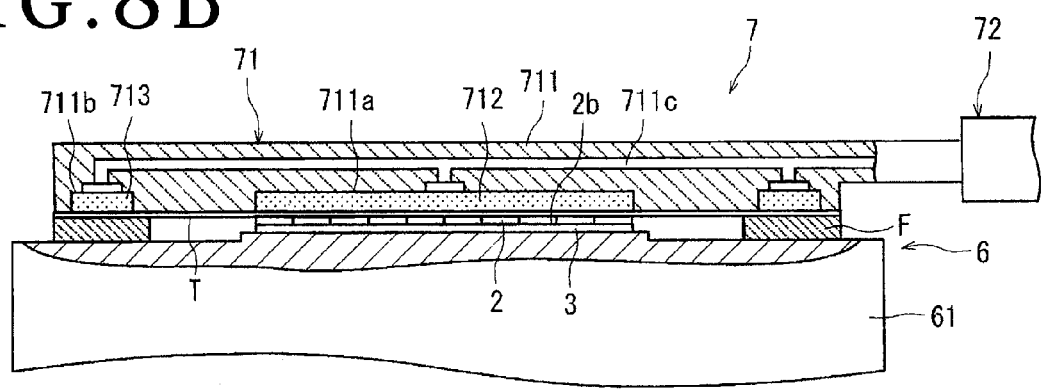

In carrying out the wafer reversing step by use of the wafer reversing unit 7, the holding pad 71 is moved to a position just over the semiconductor wafer 2 and the annular frame F which are mounted on the support table 61 of the tape adhering unit 6 and which have been subjected to the dicing tape adhering step, as shown in FIG. 8A. Then, the holding pad 71 is lowered as shown in FIG. 8B so that the surfaces (lower surfaces) of the first suction pad 712 and the second suction pad 713 are brought into contact with the upper surface, correspond to the adhesion region of the semiconductor wafer 2 and the annular frame F, of the dicing tape T. Subsequently, the suction means (not shown) is operated to cause a negative pressure to act at the surfaces (lower surfaces) of the first suction pad 712 and the second suction pad 713, whereby the whole area of the back-side surface 2b of the semiconductor wafer 2 and the annular frame F are suction held onto the surfaces (lower surfaces) of the first suction pad 712 and the second suction pad 713, through the dicing tape T therebetween.

Figure 8C:
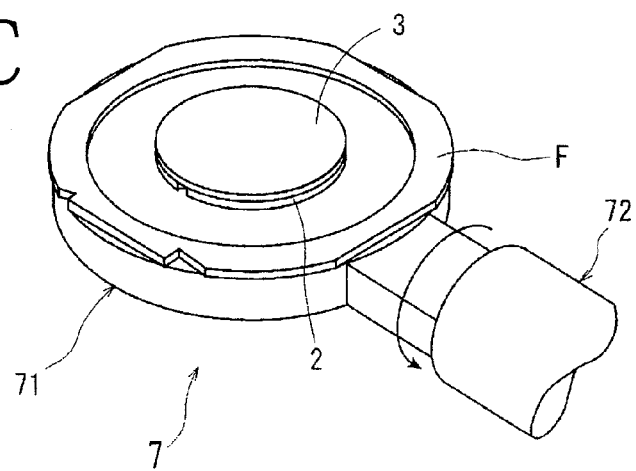

After the whole area of the back-side surface 2b of the semiconductor wafer 2 and the annular frame F are suction held on the surfaces (lower surfaces) of the first suction pad 712 and the second suction pad 713 in this manner, the holding pad 71 is moved from the position over the support base 6 of the tape adhering unit 6 and reversed, as shown in FIG. 8C. Consequently, as shown in FIG. 8C, the protective tape 3 adhered to the face-side surface 2a of the semiconductor wafer 2 adhered to the dicing tape T attached to the annular frame F is located on the upper side. In the wafer reversing step, also, the whole area of the back-side surface 2b of the semiconductor wafer 2 is suction held on the surface of the first suction pad 712 through the dicing tape T therebetween as above-mentioned, and, therefore, the semiconductor wafer 2 is not broken or damaged notwithstanding the denatured layer(s) 210 has been formed in the inside of the semiconductor wafer 2 along the streets 21 by carrying out the denatured layer forming step.

After the above-mentioned wafer reversing step is carried out, a second feeding step is conducted in which the whole area of the back-side surface of the semiconductor wafer 2 held on the holding pad 71 of the wafer reversing unit 7 is suction held through the protective tape 3, the annular frame F is also suction held, and they are fed to a tape expanding unit. The second feeding step is carried out by use of a wafer and frame feeding unit 8 shown in FIGS. 9A and 9B. The wafer and frame feeding unit 8 shown in FIGS. 9A and 9B includes a holding pad 81, and support means 82 for supporting the holding pad 81. The holding pad 81 may have substantially the same configuration as that of the holding pad 71 of the wafer reversing unit 7 described above. Specifically, the holding pad 81 includes: a holding frame 811 having a circular recess 811a formed in the lower surface of a central part thereof, and an annular recess 811b formed to surround the circular recess 811a; a circular first suction pad 812 formed from a porous ceramic and fitted in the circular recess 811a in the holding frame 811; and an annular second suction pad 813 formed from a porous ceramic and fitted in the annular recess 811b in the holding frame 811.

The circular first suction pad 812 is formed in such a size as to be able to hold the whole area of the face-side surface of the semiconductor wafer 2, and the annular second suction pad 813 is formed in such a size as to be able to hold the annular frame F. In addition, the circular recess 811a and the annular recess 811b formed in the holding frame 811 are in communication with suction means (not shown) by way of a suction passage 811c. Therefore, when the suction means (not shown) is operated, a negative pressure is made to act at the surfaces of the first suction pad 812 and the second suction pad 813 through the suction passage 811c, the circular recess 811a and the annular recess 811b. The support means 82 is so configured that the holding pad 81 can be moved in the vertical direction and horizontal directions by moving means (not shown).

In carrying out the second feeding step by use of the wafer and frame feeding unit 8, the holding pad 81 is moved to a position just over the semiconductor wafer 2 and the annular frame F which are held on the holding pad 71 of the wafer reversing unit 7, as shown in FIG. 9A. Then, the holding pad 81 is lowered as shown in FIG. 9B, whereby the surfaces (lower surfaces) of the first suction pad 812 and the second suction pad 813 are brought into contact with the upper surfaces of the protective tape 3 adhered to the face-side surface of the semiconductor wafer 2 and the annular frame F. Subsequently, the suction means (not shown) is operated to cause a negative pressure to act at the surfaces (lower surfaces) of the first suction pad 812 and the second suction pad 813, whereby the whole are of the face-side surface 2a of the semiconductor wafer 2 is suction held onto the surface (lower surface) of the first suction pad 812 through the protective tape 3 therebetween, and the annular frame F is suction held onto the surface (lower surface) of the second suction pad 813. Then, the suction holding by the holding pad 71 of the wafer reversing unit 7 is released (wafer transfer). After the whole area of the face-side surface 2a of the semiconductor wafer 2 and the annular frame F are suction held onto the holding pad 81 in this manner, the wafer and frame feeding unit 8 feeds the semiconductor wafer 2 and the annular frame F both held by the holding pad 81 to a tape expanding unit.

Figure 10:
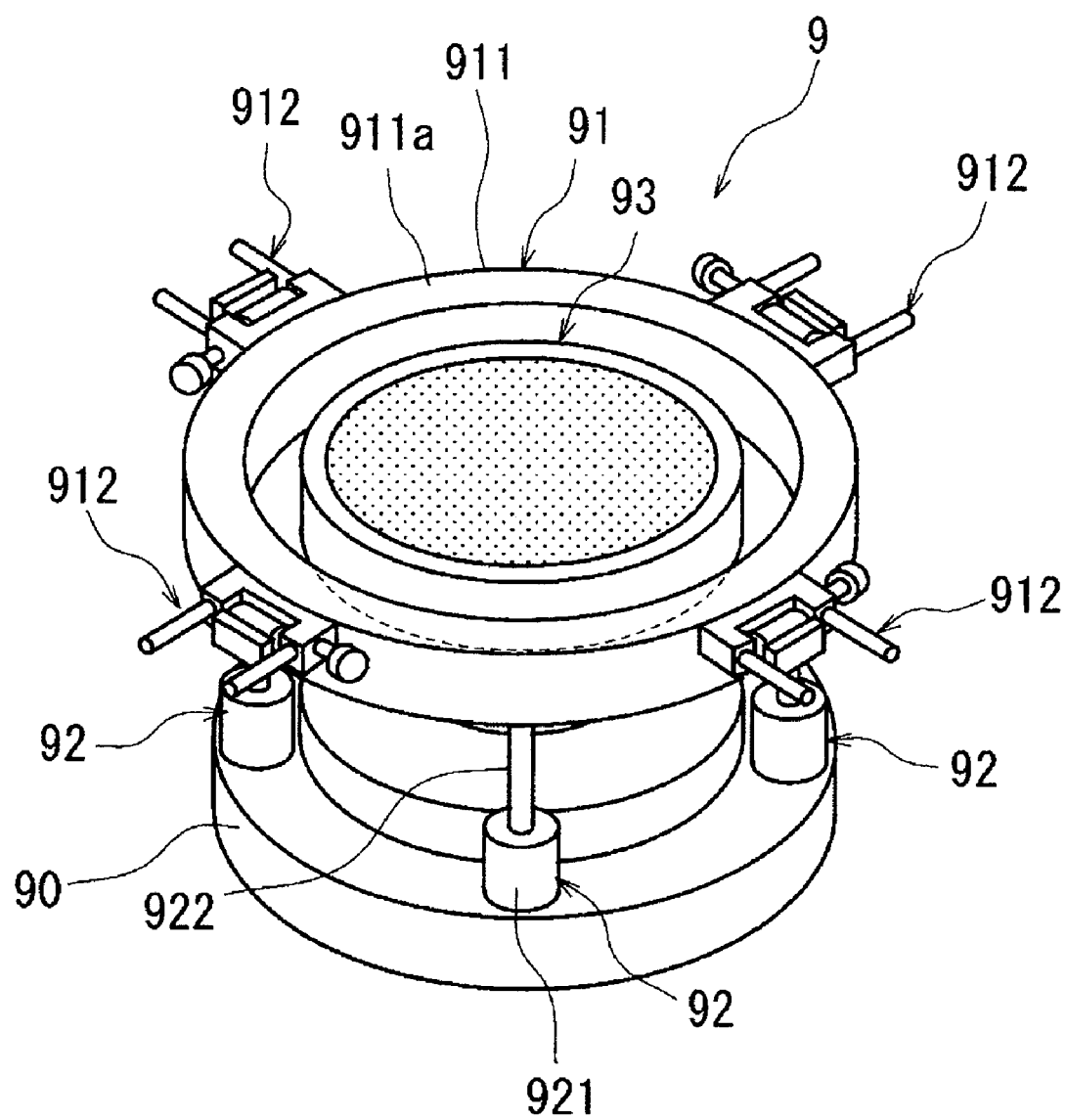
FIG. 10 is a perspective view of a tape expanding unit for carrying out the wafer dividing step in the method of dividing a wafer according to the invention.

Here, the tape expanding unit will be described referring to FIGS. 10 and 11. The tape expanding unit 9 shown in FIGS. 10 and 11 includes a circular disk-like support base 90, frame holding means 91 disposed on the upper side of the support base 90 and operative to hold the annular frame F, advancing/retracting means 92 for supporting the frame holding means 91 movably in the vertical direction, and a wafer holding table 93 disposed at the upper surface of a central part of the support base 90 and having a holding surface for holding the semiconductor wafer 2. The frame holding means 91 is included of an annular frame holding member 911, and a plurality of clamps 912 as fixing means arranged at the outer periphery of the frame holding member 911. The frame holding member 911 is provided at its upper surface with a mount surface 911a on which to mount the annular frame F, and the annular frame F is mounted on the mount surface 911a. Besides, the annular frame F mounted on the mount surface 911a is fixed to the frame holding member 911 by the clamps 912.

The advancing/retracting means 92 is included of a plurality of air cylinders 921 arranged on the support base 90, and piston rods 922 are connected to the lower surface of the annular frame holding member 911. The advancing/retracting means 92 thus included of the plurality of air cylinders 921 moves the annular frame holding member 911 in the vertical direction between a reference position at which the mount surface 911a of the annular frame holding member 911 is at substantially the same level as the holding surface, i.e., the upper surface of the wafer holding table 93 and an expansion position which is a predetermined amount below the upper surface of the wafer holding table 93.

Figure 11:
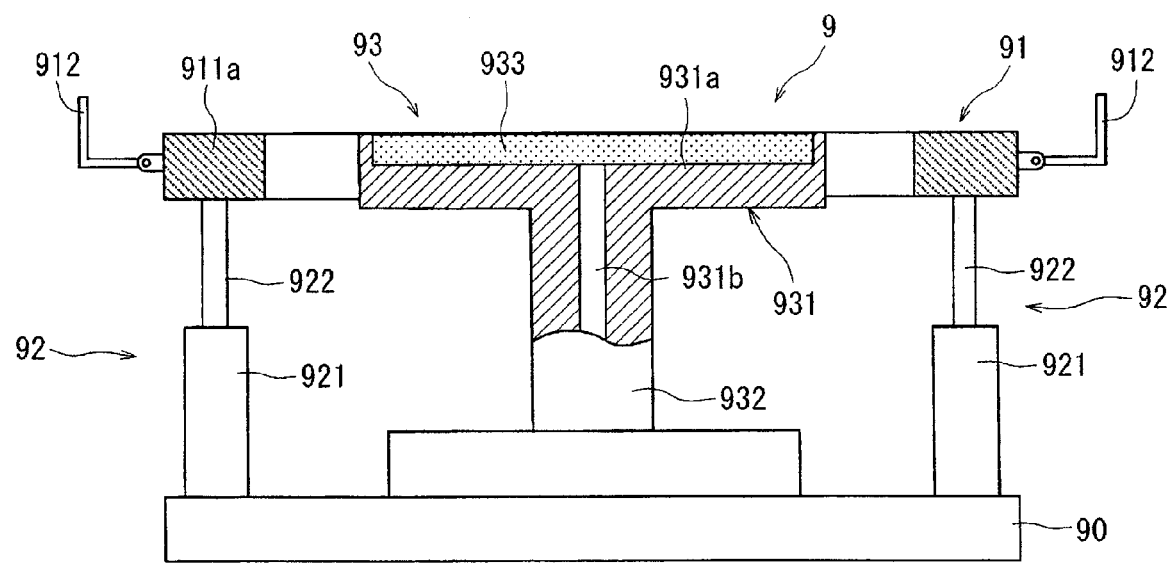
FIG. 11 is a sectional view of the tape expanding unit shown in FIG. 10.

As shown in FIG. 11, the wafer holding table 93 is included of a circular disk-like main body 931, and a support part 932 for supporting the main body 931. The circular disk-like main body 931 is provided in its upper surface with a circular recess 931a, in which a circular suction chuck 933 formed from a porous ceramic is fitted. The suction chuck 933 is formed in such a size as to be able to suction hold the whole area of the back-side surface of the semiconductor wafer 2. In addition, the recess 931a formed in the main body 931 is in communication with suction means (not shown) by way of a suction passage 931b. Therefore, when the suction means (not shown) is operated, a negative pressure is caused to act at the upper surface (holding surface) of the suction chuck 933 through the suction passage 931b and the recess 931a.

Figure 12:
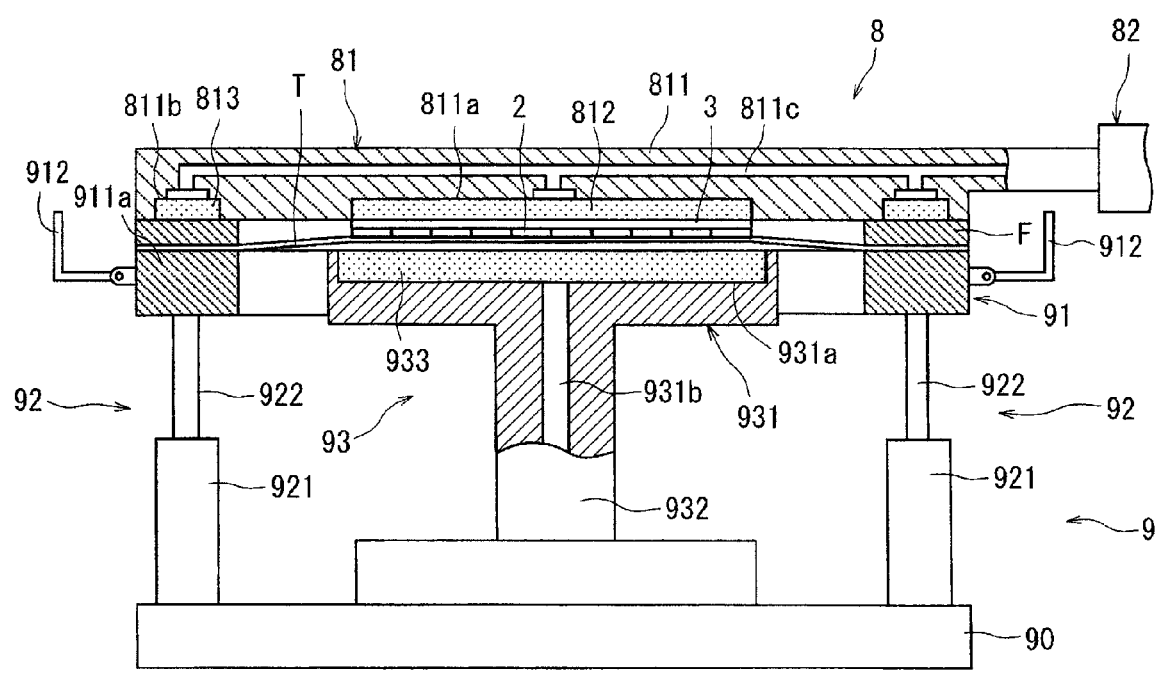
FIG. 12 illustrates a wafer mounting step in the second feeding step in the method of dividing a wafer according to the invention.

To the tape expanding unit 9 thus configured, the semiconductor wafer 2 and the annular frame F which are held by the holding pad 81 of the wafer and frame feeding unit 8 are fed (second feeding step). Specifically, the holding pad 81 of the wafer and frame feeding unit 8 is moved to a position just over the tape expanding unit 9 and lowered, as shown in FIG. 12, whereby the semiconductor wafer 2 held by the holding pad 81 is mounted on the upper surface (holding surface) of the wafer holding table 93 through the dicing tape T therebetween, and the annular frame F is mounted on the mount surface 911a of the annular frame holding member 911 constituting the frame holding means 91 (wafer mounting step). In this instance, the annular frame holding member 911 is positioned in the reference position shown in FIGS. 11 and 12. In this second feeding step, also, the whole area of the face-side surface 2a of the semiconductor wafer 2 is suction held on the surface of the first suction pad 812 constituting the holding pad 81 of the wafer and frame feeding unit 8 with the protective tape 3 therebetween and the annular frame F is suction held on the surface (lower surface) of the second suction pad 813 as above-mentioned, and, therefore, the semiconductor wafer 2 is not broken or damaged notwithstanding the denatured layer(s) 210 has been formed in the inside of the semiconductor wafer 2 along the streets 21 by carrying out the denatured layer forming step.

Figure 13A:
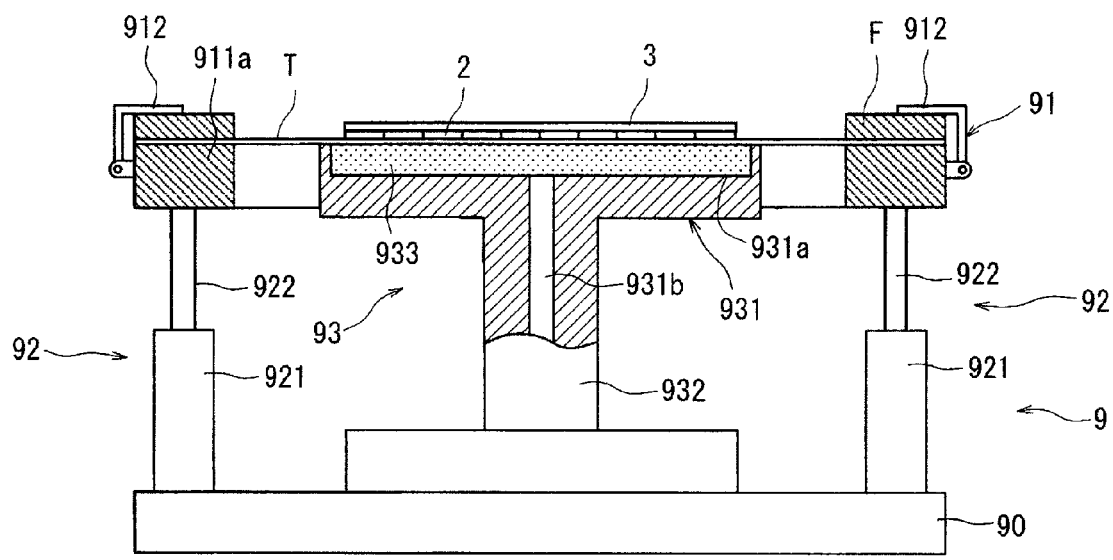
FIGS. 13A and 13B illustrate the protective tape peeling step in the method of dividing a wafer according to the invention.
Figure 13B:
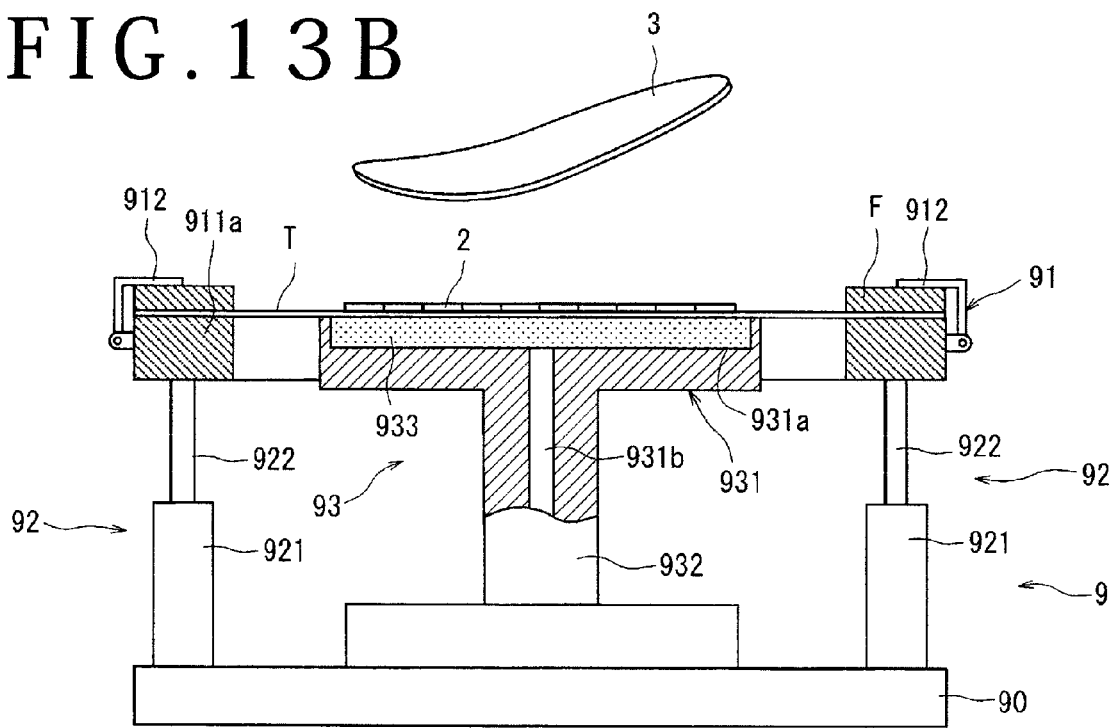

After the above-mentioned second feeding step is carried out, the suction holding of the semiconductor wafer 2 and the annular frame F by the holding pad 81 of the wafer and frame feeding unit 8 is released, the wafer and frame feeding unit 8 is retracted, and thereafter the annular frame F is fixed to the frame holding member 911 by the clamps 912, as shown in FIG. 13A. Next, the suction means (not shown) of the tape expanding unit 9 is operated to cause a negative pressure to act at the upper surface (holding surface) of the suction chuck 933 through the suction passage 931b and the recess 931a, whereby the whole area of the back-side surface 2b of the semiconductor wafer 2 is suction held onto the upper surface (holding surface) of the suction chuck 933 through the dicing tape T therebetween. In the condition where the back-side surface 2b of the semiconductor wafer 2 is thus suction held on the upper surface (holding surface) of the suction chuck 933 through the dicing tape T therebetween, the protective tape 3 adhered to the face-side surface 2a of the semiconductor wafer 2 is peeled off as shown in FIG. 13B (protective tape peeling step). At the time of peeling off the protective tape 3 in this manner, the whole area of the back-side surface 2b of the semiconductor wafer 2 is being held on the upper surface (holding surface) of the suction chuck 933 through the dicing tape T therebetween, and, therefore, the semiconductor wafer 2 is not broken or damaged notwithstanding the denatured layer(s) 210 has been formed in the inside of the semiconductor wafer 2 along the streets 21 by carrying out the denatured layer forming step.

Figure 14A:
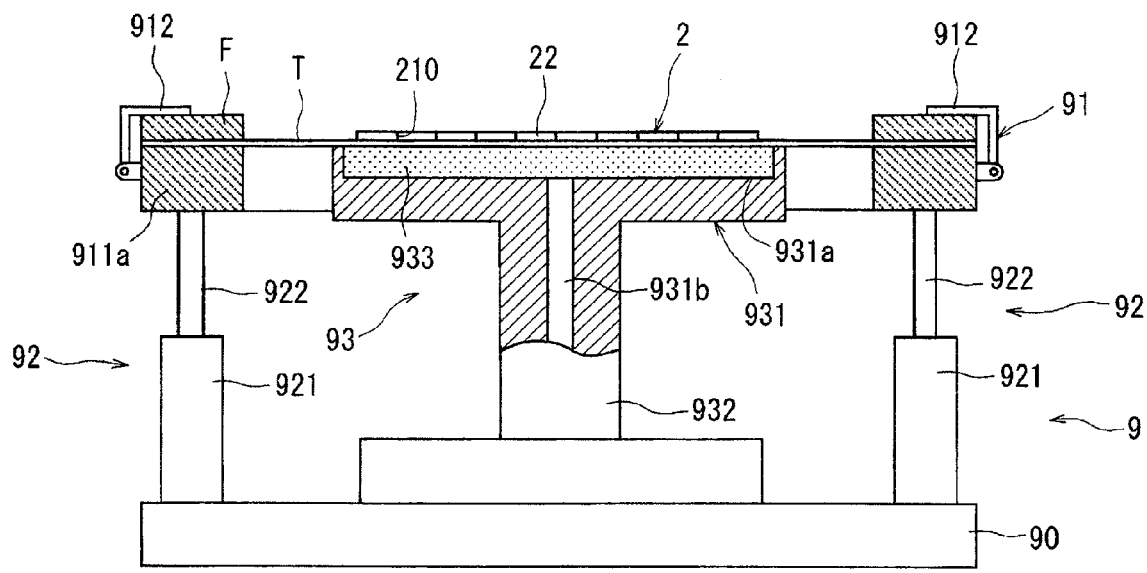
FIGS. 14A and 14B illustrate the wafer dividing step in the method of dividing a wafer according to the invention.
Figure 14B:
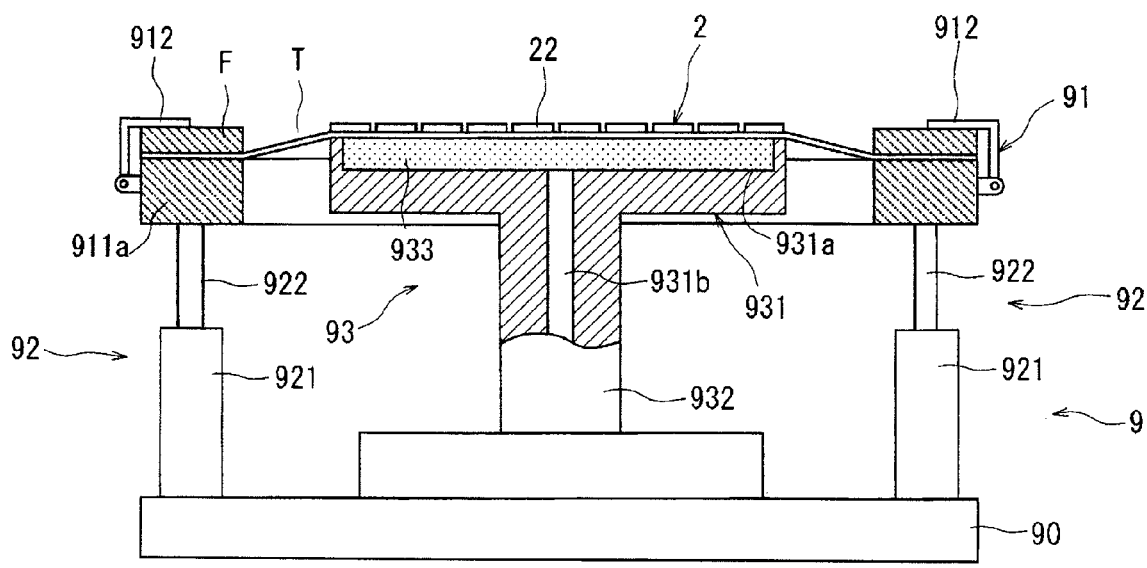

After the protective tape peeling step is carried out as above, the suction holding of the semiconductor wafer 2 by the wafer holding table 93 is released. Then, a wafer dividing step is carried out in which, by expanding the dicing tape T, the semiconductor wafer 2 is divided along the streets 21, along which the denatured layer(s) has been formed, into the individual devices 22. The wafer dividing step will be described referring to FIGS. 14A and 14B. FIG. 14A shows the condition where the protective tape peeling step has been conducted and the suction holding of the semiconductor wafer 2 by the wafer holding table 93 has been released. Starting from the condition shown in FIG. 14A, the plurality of air cylinders 921 as the advancing/retracting means 92 are operated so as to lower the annular frame holding member 911 to the expansion position shown in FIG. 4B. Therefore, the annular frame F fixed on the mount surface 911a of the frame holding member 911 is also lowered. Accordingly, as shown in FIG. 14B, the dicing tape T attached to the annular frame F comes into contact with the outer peripheral edge of the wafer holding table 93, and is expanded (tape expanding step).

As a result, radial tensile forces are exerted on the semiconductor wafer 2 adhered to the dicing tape T. With the radial tensile forces thus applied to the semiconductor wafer 2, the denatured layer(s) 210, which has been formed along the streets 21 and which has a lowered strength, serves as starting points of dividing, so that the semiconductor wafer 2 is ruptured along the denatured layer(s) 210 and divided into the individual devices 22. Incidentally, the release of the suction holding of the semiconductor wafer 2 by the wafer holding table 93 may be performed during the tape expanding step. In addition, at the time of carrying out the tape expanding step, it is desirable to heat the wafer holding table 93, thereby heating and softening that region of the dicing tape T in which the semiconductor wafer 2 is being adhered.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of dividing a wafer, provided in its face-side surface with a plurality of streets in a grid pattern and provided with devices in a plurality of regions demarcated by said plurality of streets, along said plurality of streets, said method comprising:

a protective tape adhering step of adhering a protective tape to said wafer's face-side surface;

a denatured layer forming step in which the protective tape side of said wafer with said protective tape adhered to its face-side surface is held on a chuck table of a laser beam machining apparatus, with the wafer's back-side surface on the upper side, and said wafer is irradiated from its back side with a laser beam having such a wavelength as to be transmitted through said wafer, along said plurality of streets, so as to form a denatured layer in the inside of said wafer along said plurality of streets;

a first feeding step in which, after said denatured layer forming step is carried out, the whole area of said wafer's back-side surface is suction held by a wafer feeding unit for feeding said wafer while holding said wafer by suction, and the protective tape side of said wafer is mounted on a support table of a tape adhering unit, with the wafer's back-side surface on the upper side;

a dicing tape adhering step of adhering a dicing tape to said back-side surface of said wafer mounted on said support table of said tape adhering unit and to an annular frame disposed to surround said wafer;

a wafer reversing step in which, after said dicing tape adhering step is carried out, the whole area of said wafer's back-side surface is suction held through said dicing tape and said annular frame is also suction held, by use of a wafer reversing unit for reversing said wafer and said annular frame while holding them by suction, and said wafer and said annular frame thus held are reversed face side back so that said protective tape adhered to said wafer's face-side surface is located on the upper side;

a second feeding step in which, after said wafer reversing step is carried out, the whole area of said wafer's face-side surface is suction held through said protective tape and said annular frame is also suction held, by use of a wafer and frame feeding unit for feeding said wafer and said annular frame while holding them by suction, and said annular frame is mounted on an annular frame holding member of a tape expanding unit and the dicing tape side of said wafer is mounted on a wafer holding table of said tape expanding unit, with said protective tape adhered to said wafer's face-side surface being on the upper side;

a protective tape peeling step in which said annular frame mounted on said frame holding member of said tape expanding unit is fixed, said wafer mounted on said wafer holding table is suction held through said dicing tape, and said protective tape adhered to said wafer's face-side surface is peeled off; and a wafer dividing step in which, after said protective tape peeling step is carried out, said suction holding of said wafer by said wafer holding table is released, and said dicing tape is expanded, whereby said wafer is divided along said plurality of streets along which said denatured layer has been formed, into the individual devices.

* * * * *